United States Patent
Nishikawa et al.

(10) Patent No.: US 8,877,318 B2
(45) Date of Patent: Nov. 4, 2014

(54) GRAPHITE STRUCTURE, AND ELECTRONIC DEVICE USING THE SAME

(71) Applicant: Panasonic Corporation, Kadoma (JP)

(72) Inventors: Kazuhiro Nishikawa, Osaka (JP); Naomi Nishiki, Kyoto (JP); Hidetoshi Kitaura, Osaka (JP); Kimiaki Nakaya, Osaka (JP); Atsushi Tanaka, Osaka (JP)

(73) Assignee: Panasonic Corporation, Osaka (JP)

( * ) Notice: Subject to any disclaimer, the term of this patent is extended or adjusted under 35 U.S.C. 154(b) by 0 days.

(21) Appl. No.: 13/747,721

(22) Filed: Jan. 23, 2013

(65) Prior Publication Data
US 2013/0209732 A1    Aug. 15, 2013

(30) Foreign Application Priority Data

Feb. 15, 2012  (JP) ................................ 2012-030026
Dec. 28, 2012  (JP) ................................ 2012-286414

(51) Int. Cl.
| H05K 7/20 | (2006.01) |
| F28F 13/00 | (2006.01) |
| H01L 33/64 | (2010.01) |
| F28F 21/02 | (2006.01) |

(52) U.S. Cl.
CPC ........... *H05K 7/20509* (2013.01); *F28F 13/003* (2013.01); *H01L 33/641* (2013.01); *F28F 21/02* (2013.01)
USPC .......... 428/138; 361/708; 428/408; 257/712; 165/185

(58) Field of Classification Search
CPC . H01L 23/3735; H01L 33/641; H01L 23/467; B32B 3/266; B32B 9/041; B32B 3/04; B32B 2255/205; B32B 2307/302; F28F 21/02; F28F 13/003; H05K 7/20509
USPC ................... 361/708; 428/138, 408; 257/712; 165/185

See application file for complete search history.

(56) References Cited

U.S. PATENT DOCUMENTS

| 5,975,201 | A | * | 11/1999 | Roberts et al. ................. 165/185 |
| 6,131,651 | A | * | 10/2000 | Richey, III ..................... 165/185 |
| 6,257,328 | B1 | * | 7/2001 | Fujiwara et al. ............... 165/185 |
| 7,416,789 | B2 | * | 8/2008 | Breit et al. ..................... 428/614 |
| 2007/0063339 | A1 | * | 3/2007 | Yao ............................... 257/720 |
| 2007/0172659 | A1 | * | 7/2007 | Shao ............................. 428/408 |
| 2009/0190312 | A1 | | 7/2009 | Katayama et al. |
| 2011/0056671 | A1 | * | 3/2011 | Moon et al. .................. 165/185 |
| 2011/0162792 | A1 | * | 7/2011 | Nishikawa et al. ........ 156/273.3 |

FOREIGN PATENT DOCUMENTS

| JP | 10-330177 | 12/1998 |
| JP | 2008-270724 | 11/2008 |

* cited by examiner

*Primary Examiner* — Aaron Austin
*Assistant Examiner* — Jasper Saberi
(74) *Attorney, Agent, or Firm* — Hamre, Schumann, Mueller & Larson, P.C.

(57) ABSTRACT

A graphite structure includes a graphite plate (1) that is made of a highly heat conductive material and has a thickness of 15 μm or less. A Ti layer (3) having a thickness of 10 nm to 200 nm covers the inner surfaces of through holes (2) penetrating the laminate of the graphite plate (1) from the front side to the back side of the laminate. Furthermore, continuous holes (4) are formed inside the through holes (2). This configuration can achieve a smaller thickness and high reliability while keeping high thermal conductivity of graphite.

18 Claims, 5 Drawing Sheets

GRAPHITE STRUCTURE, AND ELECTRONIC DEVICE USING THE SAME

FIELD OF THE INVENTION

The present invention eliminates thermal failures by efficiently diffusing and dissipating heat from semiconductor devices, vehicle-installed devices, and electronic equipment, which generate heat, achieving maintained or improved functions with high reliability.

BACKGROUND OF THE INVENTION

In order to prevent malfunctions or shutdowns when at least a part of a device is heated to a high temperature because of its high output, conventional semiconductor devices and vehicle-installed components are designed to propagate or release heat from Cu heat spreaders or Al radiator fins or to substrates or housings. Thus, metals or carbides having high thermal conductivity are used as materials for heat transmission and heat dissipation.

Patent Literature 1 proposes a structure including a first layer made of nanocarbon and a second layer made of an amorphous silicon material on the first layer. This configuration improves the crystallinity of nanocarbon in the first layer and improves thermal conductivity in the layer, achieving a smaller size than in a conventional heat transfer module. In this method, the first layer has thermal conductivity of about 950 W/mk to 1600 W/mk in an in-plane direction and thermal conductivity of 1.5 W/mk to 3.0 W/mk in a thickness direction, efficiently propagating and diffusing heat from a heated portion in the in-plane direction through the first nanocarbon layer. However, the nanocarbon layer and the amorphous silicon layer each have a small thickness of 1 nm to 20 nm, which is not large enough to propagate a large amount of locally generated heat.

This structure is manufactured by a thin-film process (vacuum device), and thus a long time period is necessary for increasing the thickness, causing the structure to be unsuitable for propagating a large amount of heat.

Furthermore, distortion may be created between the nanocarbon layer and the amorphous silicon layer by a stress generated according to a difference in thermal expansion coefficient between the layers in a heat cycle of heating and cooling when a device or electronic equipment is driven. Thus, cracking or peeling is highly likely to occur. The nanocarbon layer in particular, which is highly crystalline, has relatively low adhesion strength between the layers and thus is likely to reduce the reliability of the device and electronic equipment.

Patent Literature 2 describes a metal-graphite composite including a metallic thin film on at least one surface of a graphite film. The metallic thin film contains nickel, cobalt, or titanium or an alloy mainly composed of the metal, achieving excellent thermal conduction along a carbon-atom binding surface, electrical conductivity perpendicularly to the binding surface, and higher solderability on the metallic film.

CITATION LIST

Patent Literatures

Patent Literature 1: Japanese Patent Laid-Open No. 2008-270724
Patent Literature 2: Japanese Patent Laid-Open No. 10-330177

DISCLOSURE OF THE INVENTION

However, these methods cannot eliminate peeling between graphite layers owing to a stress in the heating and cooling, resulting in low reliability.

A graphite structure according to the present invention includes: a graphite plate stacked with a parallel basal plane; through holes penetrating the graphite plate from the front side to the back side of the graphite plate with the basal plane parallel to the front side and the back side; a coating layer containing a metal covering the inner surfaces of the through holes, the metal forming a compound with the carbon atoms of the graphite plate; and continuous holes formed inside the through holes with the coating layer covering the inner surfaces of the through holes, the continuous holes connecting the front side and the back side of the graphite plate.

An electronic device of the present invention includes the graphite structure on a heat dissipation path.

An apparatus of the present invention includes the electronic device.

This configuration can reduce the size, height, and weight of an electronic device and an apparatus for the device, and eliminate peeling caused by a stress generated during heating and cooling, achieving high reliability.

DESCRIPTION OF THE EMBODIMENTS

Figure 1:
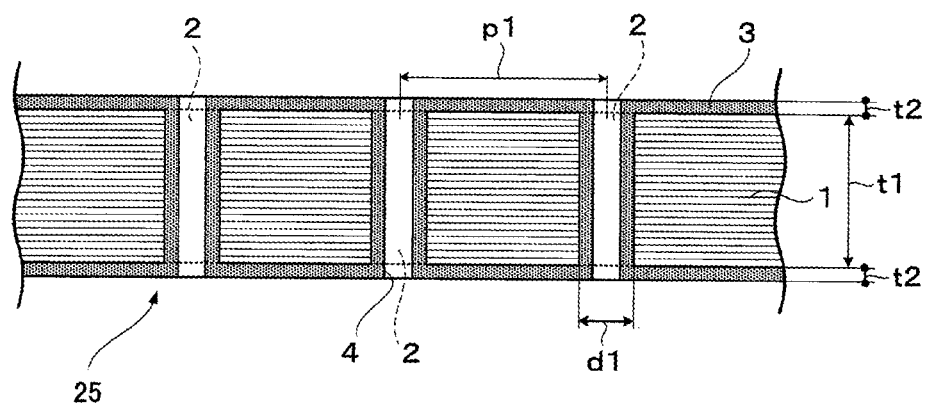
FIG. 1 is an enlarged cross-sectional view of a graphite structure according to a first embodiment of the present invention.

A graphite structure and an electronic device using the same according to the present invention will be described below in accordance with embodiments. Constituent elements having the same functions are indicated by the same reference numerals.

First Embodiment

Figure 2:
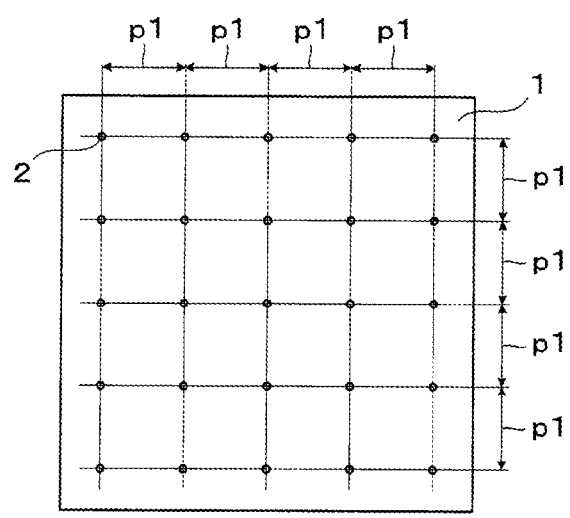
FIG. 2 is a plan view of a graphite plate used in the first embodiment.
Figure 3:
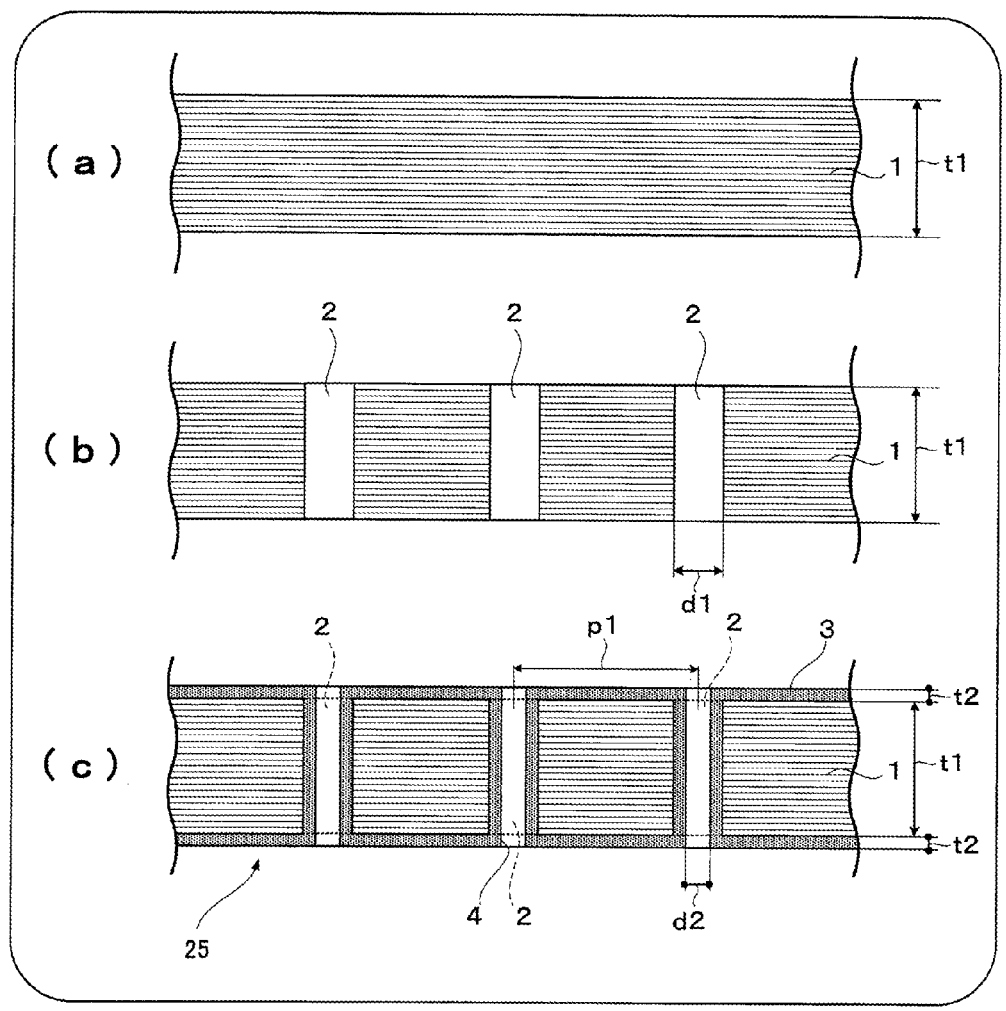
FIG. 3 is a manufacturing process drawing of the graphite structure according to the first embodiment.

FIG. 1 is an enlarged cross-sectional view of a graphite structure used between a semiconductor chip or a package and a radiator plate according to a first embodiment. FIG. 2 is a plan view showing an example of a graphite plate 1 being processed for the fabrication of the graphite structure. FIG. 3 shows a manufacturing process.

The flat graphite plate 1 used for fabricating a graphite structure 25 has a matrix of through holes 2 with a pitch p1 (see FIG. 2). The front side and back side of the graphite plate 1 and the inner surface of the through hole 2 are covered with a Ti layer 3 that is a coating layer reactive to the carbon atoms of the graphite plate 1. Reference character t1 denotes the thickness of the graphite plate 1 and reference character t2 denotes the thickness of the Ti layer 3 on the front side and back side of the graphite plate 1. Opening continuous holes 4 are vertically provided inside the respective through holes 2. FIG. 2 shows the graphite plate 1 uncovered with the Ti layer 3. The continuous hole 4 is useful for sucking components disposed on the top and bottom of the graphite structure 25 when the graphite structure 25 is used. The continuous holes 4 will be specifically described in a second embodiment.

The graphite plate 1, which is composed of a high-polymer film having a thickness of 50 μm or less, is produced by processing a thin plate (FIG. 3(a)) at a temperature higher than 2500° C. under a certain pressure in a reducing atmosphere. Thus, the graphite plate 1 is stacked with a parallel basal plane composed of 6-membered rings of carbon. The thickness t1 between the front side and back side of the graphite plate 1 is 15 μm or less. When the thickness t1 is larger than 15 μm, crystallinity and thermal conductivity are reduced. Moreover, the application is limited for smaller and lower-profile devices and equipment.

The front side and back side of the graphite plate 1 are substantially in parallel with the plane (basal plane) composed of 6-membered rings of carbon. The graphite plate 1 has thermal conductivity of 1000 W/mk or higher in the parallel direction and has thermal conductivity of 5 W/mk or lower in the vertical direction. Furthermore, the graphite plate 1 has a specific gravity not larger than 2.25 g/cm$^3$, conductivity of at least 10$^6$ S/m, and a Young's modulus of at least 750 GPa.

The graphite plate 1 desirably has a surface roughness of 1 μm to 4 μm. In this configuration, the surface roughness is 2 μm. When the surface roughness is smaller than 1 μm, the Ti layer 3 on the graphite plate 1 becomes less adhesive and is peeled off in a heat cycle. Conversely, when the surface roughness exceeds 4 μm, the Ti layer 3 becomes less adhesive. Moreover, when the surface roughness of the graphite plate 1 exceeds 4 μm, adhesion between a semiconductor device and the graphite structure decreases, leading to lower thermal conduction.

The through holes 2 formed perpendicularly to the plane of the graphite plate 1 allow the Ti layer 3 provided on the front and back sides of the graphite plate 1 to be continuously formed over the front and back sides through the through holes 2. Ti has a great affinity for C and a barrier metal (mainly Ni) material used for semiconductor packages. In this case, the affinity means adhesion and low interfacial thermal resistance.

The through holes 2 can be located at any positions. In order to improve the reliability of the graphite plate 1, the graphite plate 1 desirably has a matrix including the maximum size of the graphite plate 1 used for a device.

The ratio (density) of openings of the through holes 2 needs to be 10% or less relative to the whole surface area of the graphite plate 1. Preferably, the ratio is 7% or less. If the ratio is larger than 10%, the through holes 2 interfere with thermal conduction in a planar direction, whereas if the ratio is smaller than 0.1%, peeling between graphite layers is unsatisfactorily suppressed, causing lower heat conduction and peeling of layers. The shape of the through hole 2 is not limited to a circle.

The through holes 2 can be formed by, for example, machining with a Thomson blade. The Thomson blade embedded into rubber is pressed to pierce the graphite plate 1. The graphite plate 1 may be machined with high pressure water. The method of machining is not particularly limited. FIG. 3(b) shows the graphite plate 1 having the through holes 2.

The Ti layer 3 is provided by evaporation, sputtering, or plating. The Ti layer 3 has the thickness t2 of 0.01 μm to 0.2 μm. In the case where the thickness t2 is smaller than 0.01 μm, the Ti layer 3 may have defects such as voids. In the case where the thickness t2 is larger than 0.2 μm, it is difficult to reduce the size and height of the device and the electronic equipment. The Ti layer 3 is highly adhesive, leading to material failure of the graphite plate 1 in a failure mode during a peel test of cellophane adhesive tape.

FIG. 3(c) shows the graphite structure 25 produced thus. In the first embodiment, the formed Ti layer 3 does not fill the through holes 2 that contain the continuous holes 4. The continuous hole 4 has a diameter d2 determined by "d1−2·t2".

The graphite plate 1 including the through holes 2, the Ti layer 3, and the continuous holes 4 improves adhesion to the barrier metal layer of a chip die or a metallic heat spreader when the graphite plate 1 is assembled into the semiconductor device. For a shearing stress applied to the graphite plate 1 in a heating and cooling cycle when the semiconductor device is driven, the effect of the Ti layer 3 in the through holes 2 reduces shearing strain caused by a thermal expansion difference in the planar direction, precluding cracks and peeling on the graphite plate 1.

Thus, the graphite structure made of a highly heat conductive composite material is used as a heat-resistant component in a semiconductor package, a vehicle-installed device, a power device, or an LED device, reducing the size, thickness, and weight of the device. For example, a semiconductor device for a high-end computer CPU particularly generates a large amount of heat depending upon an operating frequency. Thus, the operating frequency and a driving voltage automatically decrease to safely drive the device, reducing a response speed and a processing speed. Then, if a temperature does not decline, the device may be automatically stopped. In order to prevent such failure, heat generated in a chip die of a semiconductor package is propagated through a copper heat spreader and then is released into the air through a dissipating member such as an aluminum fin. Alternatively, heat is propagated to a mounted substrate through a connected point so as to reduce the temperature.

As the degree of semiconductor integration dramatically increases, however, the heating temperature and the heating speed of the CPU are raised. In the heat dissipating method, heat is diffused and propagated at low speed from a heated portion to a dissipating component and thus the foregoing problem cannot be solved. The present invention is quite effective under such circumstances. To be specific, the graphite structure is used instead of heat conductive grease containing metal powder such as aluminum powder used for propagating heat in a chip die to a heat spreader, a low melting metal such as indium, or an alloy of the metal. Concretely, the graphite structure is provided between the chip die and the heat spreader. This allows heat generated in the chip die to be more quickly diffused into the plane of the graphite plate 1 and then propagated through the heat spreader, cooling the heated portion of the chip die to a lower temperature. Thus, a high operating frequency can be maintained without reducing the processing speed and response speed of the CPU. Moreover, the use of the graphite structure can maintain a high operating frequency and achieve fabrication of a device with a smaller size, a smaller thickness, and a lighter weight than in the conventional configuration.

The graphite plate 1 according to the first embodiment was produced by processing a polyimide film (25 μm in thickness)

of DuPont-Toray Co., Ltd. at 3000° C. in a reducing atmosphere to have a size of 60 mm×60 mm, the thickness t1 of 10 µm, and a surface roughness of 2 µm. The features of the graphite plate 1 include thermal conductivity of 1500 W/m·k in the planar direction, thermal conductivity of 3 W/m·k in a direction perpendicular to the planar direction, a specific gravity of 2.3, and an elasticity modulus of 750 GPa.

As shown in FIG. 2, the 25 circular through holes 2 were formed on the graphite plate 1, which measured 60 mm×60 mm, by using a Thomson blade. The diameter d1 of the through hole 2 was 1 mm. Then, the Ti layer 3 was continuously formed on the front and back sides of the graphite plate 1 and the sides of the through holes 2 by sputtering. The thickness t2 of the Ti layer 3 was 0.2 µm. At this point, the through holes 2 penetrated the graphite plate 1 and contained the continuous holes 4 while the centers of the through holes 2 were not filled with the Ti layer 3. In this example, the total area of the through holes 2 was 19.6 mm$^2$ which is 0.5% relative to the total area of the graphite plate 1.

<Evaluation>

In the present embodiment, thermal shock tests were conducted in 500 cycles, 1000 cycles, and 2000 cycles at −65° C. to 120° C. Peeling or an appearance defect was not found after the tests.

Second Embodiment

Figure 4:
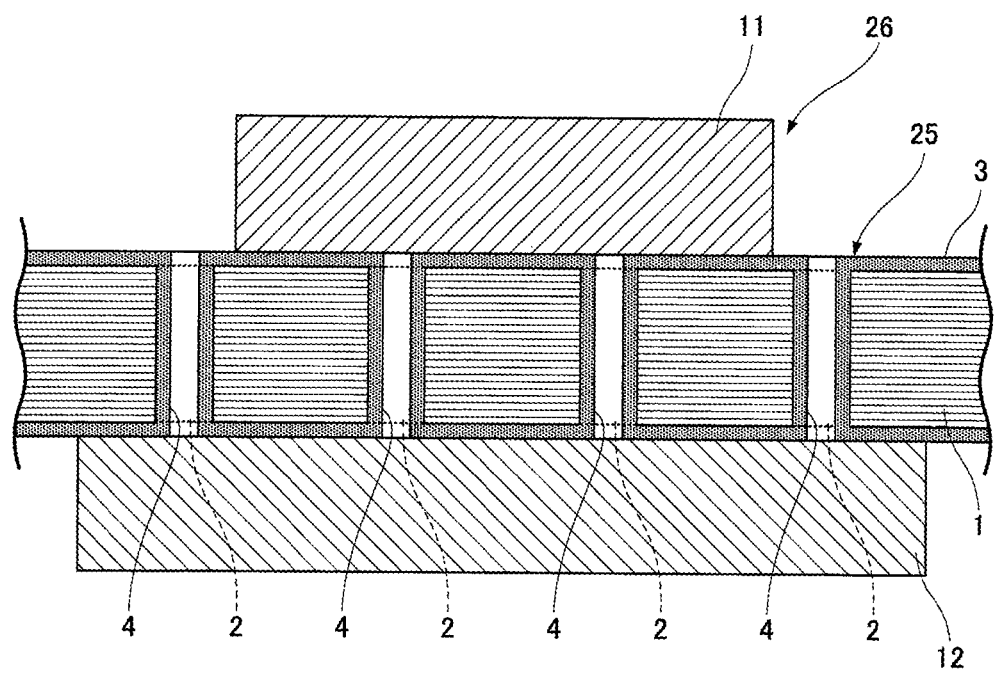
FIG. 4 is an enlarged cross-sectional view of an electronic device using a graphite structure according to a second embodiment of the present invention.

FIG. 4 shows a second embodiment.

FIG. 4 is an enlarged cross-sectional view of an electronic device 26 of the second embodiment, the electronic device 26 using the graphite structure of the first embodiment.

A first member 11 is disposed on the front side of a graphite plate 1. A second member 12 is disposed on the back side of the graphite plate 1. The first member 11 is, for example, a dissipating member or a cooling member. The second member 12 is, for example, a semiconductor element or an electronic component. Constituent elements not illustrated in FIG. 4 are identical to those of the first embodiment.

A through hole 2 contains a continuous hole 4. The through hole 2 has a diameter d1 of 1 mm. A Ti layer 3 has a thickness of 0.2 µm. The graphite plate 1 has a mirror-like surface with small roughness of 3 µm or less. Thus, the graphite plate 1 with the front and back sides covered with the Ti layer 3 is in intimate contact with the first member 11 and the second member 12. The first member 11 and the second member 12 are substantially in contact with the graphite plate 1 via the Ti layer 3; meanwhile, the temperature of the first member 11 is raised so as to expand air in the continuous holes 4, causing the internal pressures of the continuous holes 4 to exceed the external pressures of the continuous holes 4. As the internal pressures of the continuous holes 4 increase, air in the continuous holes 4 is released between the first member 11 and the Ti layer 3 and between the second member 12 and the Ti layer 3. In this state, the temperature of the first member 11 is lowered so as to increase the degree of vacuum in the continuous holes 4, integrating the graphite plate 1, the first member 11, and the second member 12 through the continuous holes 4. This eliminates the need for grease or heat conductive adhesive on a contact surface.

Third Embodiment

Figure 5:
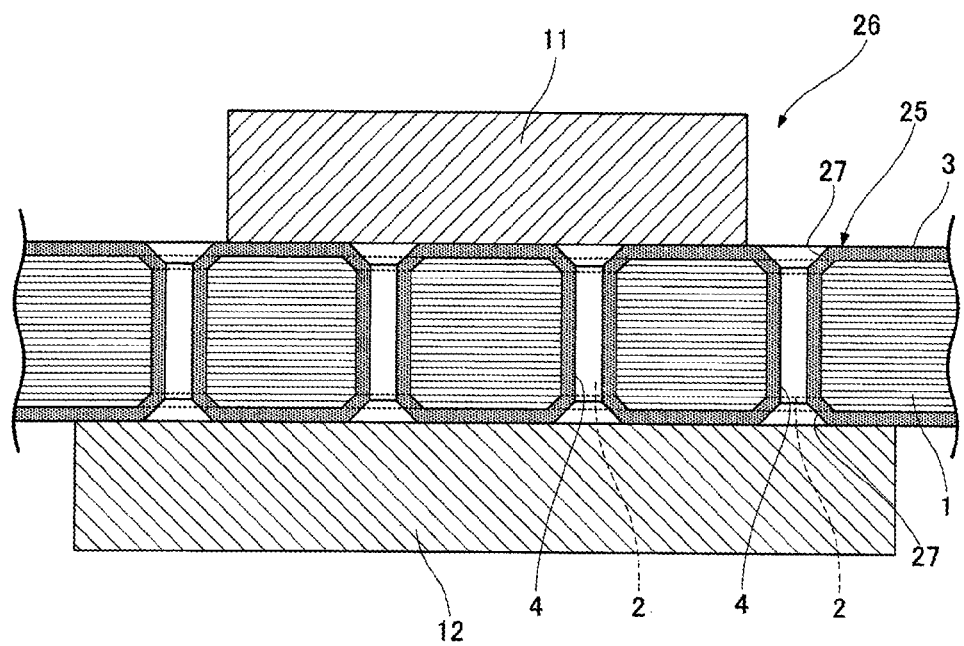
FIG. 5 is an enlarged cross-sectional view of an electronic device using a graphite structure according to a third embodiment of the present invention.

FIG. 5 shows a third embodiment.

In the second embodiment, the through hole 2 having the single diameter d1 penetrates the graphite plate 1 from the front side to the back side, and the continuous hole 4 having the single diameter also penetrates the graphite plate 1 from the front side to the back side. In a graphite structure 25 used in an electronic device 26 of the third embodiment, continuous holes 4 are not identical in shape to those of the second embodiment.

In the graphite structure 25 according to the third embodiment, the openings of the continuous holes 4 increase in diameter toward the exterior. Specifically, the continuous holes 4 are externally opened into tapered shapes 27. For this configuration, through holes 2 are also externally opened into tapered shapes.

In the case where the continuous holes 4 are opened into the external tapered shapes 27, first and second members 11 and 12 are sucked by reducing the internal pressures of the continuous holes 4 more strongly than in the second embodiment.

The total area of the through holes 2 is preferably set at 10% or less relative to the total area of a graphite plate 1 to obtain thermal conduction. If the area is smaller than 0.1%, the layers of the graphite plate 1 cannot be sufficiently pressed, hampering heat conduction. In this case, the defined area of the through hole 2 is a cross-sectional area at the center of the interior of the through hole 2, not an opened portion on the end (top and bottom) of the through hole 2. In other words, the area is defined with the diameter of the smallest cross-sectional area, which determines heat transfer capability.

In the case of a Ti layer 3 having a thickness t2, the diameter of the continuous hole 4 is determined by subtracting 2·t2 from the diameter of the through hole 2. Since the thickness t2 is about 0.2 µm, the total area of the through holes 2 is substantially equal to that of the continuous holes 4.

Fourth Embodiment

Figure 6:
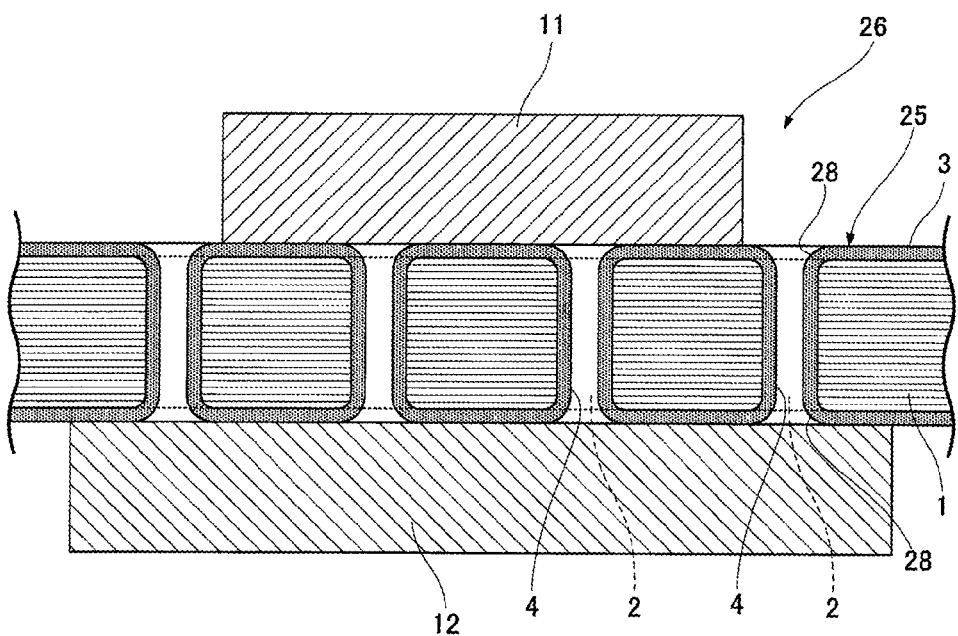
FIG. 6 is an enlarged cross-sectional view of an electronic device using a graphite structure according to a fourth embodiment of the present invention.

FIG. 6 shows a fourth embodiment.

In the second embodiment, the through hole 2 having the single diameter d1 penetrates the graphite plate 1 from the front side to the back side, and the continuous hole 4 having the single diameter also penetrates the graphite plate 1 from the front side to the back side. In a graphite structure 25 used in an electronic device 26 of the fourth embodiment, continuous holes 4 are not identical in shape to those of the second embodiment.

In the graphite structure 25 of the fourth embodiment, the openings of the continuous holes 4 increase in diameter toward to the exterior. Specifically, the continuous holes 4 are opened into rounded shapes 28 that gradually increase in cross-sectional area from the interior to the exterior. For this configuration, through holes 2 are also externally opened into rounded shapes.

In the case where the continuous holes 4 are opened into the external rounded shapes 28, first and second members 11 and 12 are sucked by reducing the internal pressures of the continuous holes 4 more strongly than in the second embodiment. The area ratio of the continuous holes 4 and the definition of the area are identical to those of the third embodiment.

Fifth Embodiment

Figure 7:
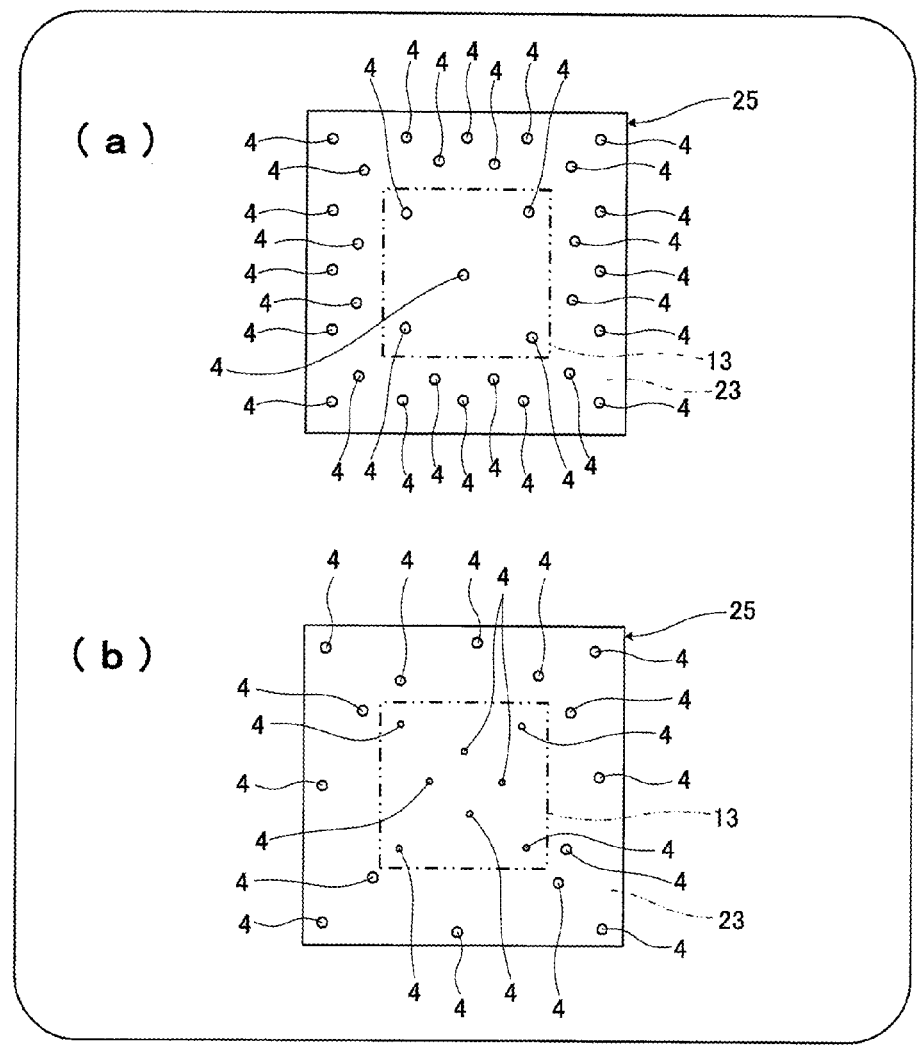
FIG. 7 is a plan view of a graphite structure according to a fifth embodiment of the present invention.

FIGS. 7(a) and 7(b) show a graphite structure 25 according to a fifth embodiment.

In the first embodiment, as illustrated in FIG. 2, the through holes 2 are evenly distributed in the plane of the graphite plate 1. Thus, the continuous holes 4 are also evenly distributed in the plane of the graphite structure 25.

In FIG. 7(a), the fifth embodiment is different from the first embodiment in that continuous holes 4 are unevenly disposed in a plane.

If a graphite plate 1 has a large number of through holes 2 and continuous holes 4 that are formed in the through holes 2 through a Ti layer 3, the Ti layer 3 reliably presses and fixes the graphite plate 1 in the thickness direction of the graphite plate 1, obtaining thermal conductivity. Heat conduction, however, stops at the through holes 2 and the continuous holes 4, leading to lower thermal conduction in a lateral direction (the planar direction of the graphite plate 1).

In FIG. 7(a), the density of the through holes 2 and the continuous holes 4 on the graphite plate 1 varies between a layout area 13 where the first and second members 11 and 12 of the second embodiment are located and a peripheral area 23 where the first and second members 11 and 12 are not located. Specifically, the through holes 2 and the continuous holes 4 are all identical in diameter in the layout area 13 and the peripheral area 23, and the total area density of the through holes 2 and the continuous holes 4 in the peripheral area 23 is set higher than that in the layout area 13 so as not to interfere with thermal conduction in the layout area 13.

With this configuration, heat generated in the second member 12 is first quickly transferred from the layout area 13 to the peripheral area 23, allowing prompt cooling of the second member 12. The peripheral area 23 including the large number of through holes 2 and continuous holes 4 has lower thermal conduction than in the layout area 13 but prevents peeling of layers and obtains vertical heat conduction over the graphite plate 1.

In this example, the total area density of the through holes 2 and the continuous holes 4 in the layout area 13 is about a half of that in the peripheral area 23. At least a double density difference is preferable because thermal conductivity can be obtained and peeling of graphite layers can be prevented.

In FIG. 7(b), the through holes 2 and the continuous holes 4 of the graphite structure 25 are varied in diameter between the layout area 13 and the peripheral area 23 and thus are unevenly distributed in the plane. Specifically, the through holes 2 and the continuous holes 4 in the layout area 13 are smaller in diameter than in the peripheral area 23 so as not to interfere with thermal conduction. In the layout area 13 of the first member 11, the total area density of the through holes 2 and the continuous holes 4 is a half of that in the peripheral area 23. In this case, the graphite structure can have high thermal conduction without the need for a large number of through holes 2 and continuous holes 4 in the peripheral area 23.

Sixth Embodiment

Figure 8:
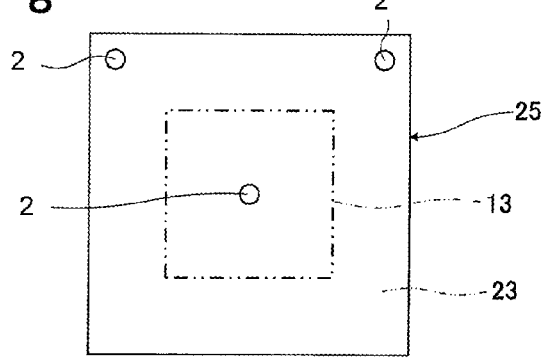
FIG. 8 is a plan view of a graphite plate used in a sixth embodiment of the present invention

FIG. 8 is a plan view of a graphite plate 1 used for a graphite structure 25 according to a sixth embodiment.

The graphite plate 1 has a minimum number of through holes 2, each having a maximum diameter. The ratio of the through holes 2 is 10% or less relative to the area of the graphite plate 1. The through holes 2 identical in size need to be placed at three points or more to fix and protect the layers of the graphite plate 1. Consequently, the maximum area of the through hole 2 needs to be 3.3% or less relative to the overall area of the graphite plate 1.

Furthermore, first and second members 11 and 12 are fixed to the graphite plate 1 by reducing the internal pressures of continuous holes 4 formed by a Ti layer 3 in the through holes 2. Thus, a layout area 13 containing the first and second members 11 and 12 of the graphite structure 25 needs to have at least one of the through holes 2.

Hence, in FIG. 8, one of the through holes 2 is located at the center of the layout area 13 while two of the through holes 2 are located on the end of a peripheral area 23. Naturally, the through holes 2 having a smaller diameter may be evenly provided in the peripheral area 23.

The Ti layer 3 needs to have a thickness t2 of at least 0.01 mm. Thus, in the case where the Ti layer 3 is formed on the inner surface of the through hole 2 to form the continuous hole 4 having a thickness d2 of 0.01 mm inside the Ti layer 3, the through hole 2 needs to have a minimum diameter d1 of 0.03 mm.

In the foregoing embodiments, a protective film is not provided on the Ti layer 3. Instead, an antioxidant film for improving the durability of the Ti layer 3 may be used. For example, a nitride of WN or TiN, fluoride of fluorocarbon, and an organic polymer of p-xylene or acryl are usable. Moreover, insulating layers such as a diamond-like carbon layer and a polymer layer may be provided depending on the need for electrical isolation.

In the foregoing embodiments, the Ti layer 3 is used that is a coating layer reactive with carbon atoms. The coating layer may contain metals such as nickel, cobalt, and titanium that are reactive with carbon atoms, that is, metals forming a carbon compound, and an alloy mainly composed of these metallic elements.

In the foregoing embodiments, the through holes 2 and the continuous holes 4 are circular. The through holes 2 and the continuous holes 4 may be triangular or oval.

The foregoing embodiments may be combined in the absence of hindrances.

The present invention is used for various applications requiring measures for heat, for example, a semiconductor, a solar cell, an electric vehicle, and a lighting device, achieving higher reliability and lower-profile devices.

What is claimed is:

1. A graphite structure comprising:
    A graphite plate comprising a plurality of parallel basal plane layers which are composed of 6-membered rings of carbon, the graphite plate having a front side, a back side, and a thickness defined between the front and back sides, with the basal plane layers parallel to the front side and the back side;
    A plurality of through holes formed in the thickness of the graphite plate;
    Wherein the through holes have a total area of not less than 0.1% and not more than 10% relative to an area of the graphite plate, and the through holes have a maximum pore size smaller than 3.3% relative to the area of the graphite plate; and
    A coating layer containing a metal covering an inner surface of each of the through holes, thereby forming continuous holes in the respective through holes, the continuous holes being configured to communicate air on the front side of the graphite plate with air on the back side, the metal forming a compound with carbon atoms of the graphite plate;
    Wherein when in use the continuous holes are configured to draw a first member and a second member to the front and back sides of the graphite plate, respectively, by reducing an air pressure within the continuous holes.

2. The graphite structure according to claim 1, wherein the coating layer is formed continuously over the front side and the back side of the graphite plate.

3. The graphite structure according to claim 1, wherein each of the continuous holes is opened so as to increase in diameter toward an exterior.

4. The graphite structure according to claim 1, wherein the graphite plate has a layout area where an electronic component is located and a peripheral area where the electronic component is not located, and the peripheral area has a higher total area density of the through holes than the layout area.

5. The graphite structure according to claim 4, wherein in the layout area where the electronic component is located, the through holes of the graphite plate are smaller in diameter than in the peripheral area.

6. The graphite structure according to claim 1, wherein the coating layer contains one of nickel, cobalt, titanium, or an alloy composed of one of these elements.

7. The graphite structure according to claim 1, wherein the graphite plate has a specific gravity of not larger than 2.25 g/cm$^3$, conductivity of at least 10$^6$ S/m, and a Young's modulus of at least 750 GPa.

8. The graphite structure according to claim 1, further comprising an antioxidant film on the coating layer,
wherein the coating layer is a titanium layer, and
the antioxidant film is selected from the group consisting of nitride, fluoride, polymer and diamond-like carbon.

9. The graphite structure according to claim 1, wherein the graphite plate has a surface roughness of 1 µm to 4 µm.

10. An electronic device comprising the graphite structure according to claim 1 on a heat dissipation path.

11. An apparatus comprising the electronic device according to claim 10.

12. The graphite structure according to claim 2, wherein a thickness of the coating layer formed on the front side and the back side of the graphite plate is the same as a thickness of the coating layer formed on an inner surface of each of the through holes.

13. The graphite structure according to claim 1, wherein the coating layer is further disposed on the front side of the graphite plate and the back side of the graphite plate such that the coating layer disposed on the front side of the graphite plate and the back side of the graphite plate and the coating layer forming the continuous holes is a continuous layer.

14. The graphite structure according to claim 1, wherein the coating layer is further disposed on the front side of the graphite plate and the back side of the graphite plate such that the coating layer in the continuous holes are connected to each other by the coating layer disposed on the front and back sides of the graphite plate.

15. The graphite structure according to claim 1, wherein the thickness of the graphite plate is 15 µm or less.

16. The graphite structure according to claim 1, wherein the first member is a heat dissipating member and the second member is an electronic component.

17. The graphite structure according to claim 16, wherein the air pressure in the continuous holes is reduced by raising a temperature of air inside the continuous holes and thereby driving the air out of the continuous holes from a gap formed between the first member and the front side of the graphite plate or from a gap formed between the second member and the back side of the graphite plate.

18. The graphite structure according to claim 1, wherein a diameter of at least one of the through holes is 1 mm.

* * * * *